CONTROL SYSTEM FOR STABILIZING THE FREQUENCY OF AN OSCILLATOR

Filed Dec. 28, 1960 2 Sheets-Sheet 1

INVENTOR
PETER R. MARZAN
BY John J. Rogan
ATTORNEY

Aug. 31, 1965 P. R. MARZAN 3,204,197

CONTROL SYSTEM FOR STABILIZING THE FREQUENCY OF AN OSCILLATOR

Filed Dec. 28, 1960 2 Sheets-Sheet 2

INVENTOR
PETER R. MARZAN
BY John J. Rogan
ATTORNEY

United States Patent Office 3,204,197
Patented Aug. 31, 1965

3,204,197
CONTROL SYSTEM FOR STABILIZING THE FREQUENCY OF AN OSCILLATOR

Peter R. Marzan, New City, N.Y., assignor to Westrex Corporation, New York, N.Y., a corporation of Delaware Filed Dec. 28, 1960, Ser. No. 79,035
9 Claims. (Cl. 331—55)

This invention relates to oscillatory systems and more especially it relates to systems for controlling or stabilizing a normally unconstrained or free-running oscillator.

A principal object of the invention is to provide a novel arrangement for controlling the frequency of an oscillator of the normally unconstrained or free-running kind.

Another object is to provide an arrangement whereby a so-called free-running oscillator can be constrained to lock with a precision or standard frequency source, the locking-in operation being substantially independent of the relation between the oscillator frequency and that of said source.

A feature of the invention relates to the combination of a free-running oscillator of one frequency and a standard frequency oscillator of a different frequency, both of which are intercoupled so that the free-running oscillator can be locked to the standard oscillator when the two frequencies are widely unrelated to each other.

Another feature relates to a frequency-stabilized slave oscillator which is controlled from a standard or stabilized-frequency source and is locked to that source by a plural-wave differentiating and gating control whereby the locking operation can be achieved regardless of whether the frequencies of the slave oscillator and the said source are, or are not, integrally related.

A further feature relates to the novel organization, arrangement and relative interconnection of parts which cooperate to provide an improved frequency control system for so-called free-running oscillators.

Other features and advantages will appear from the ensuing descriptions, the appended claims and the attached drawings.

While the invention will be illustrated and explained in connection with certain known kinds of oscillators, it will be understood that such is done without limitation to any specific apparatus so long as such apparatus embodies the inventive concepts thereof.

It is common practice in the oscillator art to employ a so-called free-running oscillator which is constrained to operate at a predetermined frequency by being locked under control of the frequency of a standard frequency source. For example, the free-running oscillator may be coupled to a crystal-controlled, fork-controlled, or any other stabilized electron tube oscillator so that the latter exercises the required constraint on the free-running oscillator to make sure that the free-running oscillator runs at a predetermined frequency. However, these prior arrangements have all required that the frequency at which the free-running oscillator is to run or the frequency for which it is normally designed bears an integer, or whole-number, relation to the stabilized frequency of the standard source, or at least a predetermined fixed ratio with respect to said source. Consequently the range of usefulness of such locked-in oscillators is materially restricted since they have been based upon the theory that the natural frequency of the free-running oscillator is substantially equal to the recurrence rate of the input control signal applied thereto. (See "Pulse and Digital Circuits" by Millman and Taub, chapter 12, published by McGraw-Hill Book Company, 1956.) According to the present invention, the free-running oscillator is automatically locked under control of the frequency of the standard source even though the ratio of these two frequencies is not necessarily an integer, and independently of a fixed predetermined ratio between those frequencies. Accordingly, it is possible, according to the invention, to operate a free-running oscillator at any ratio with respect to the the standard source.

Figure 1:
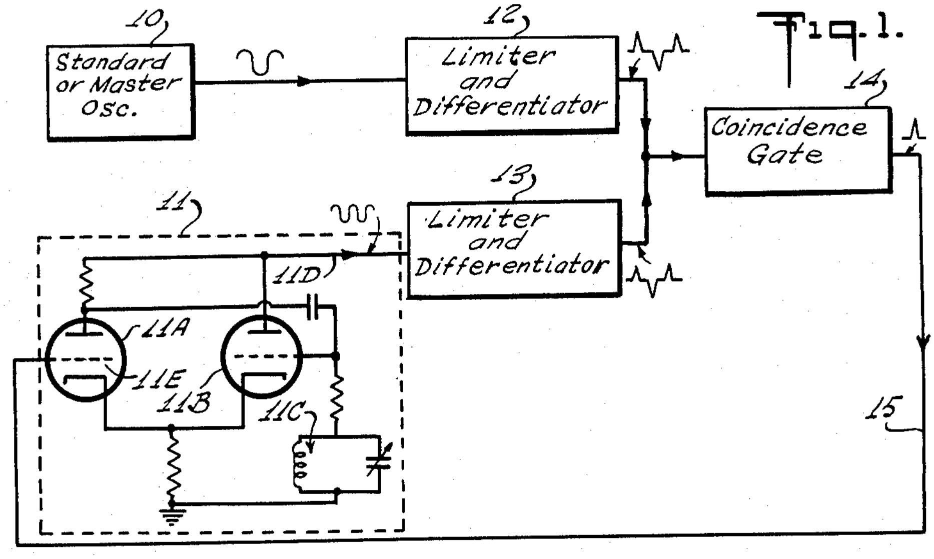
FIG. 1 is a schematic block diagram of a system of frequency control according to the invention.

Referring to FIG. 1 of the drawing, the block 10 represents any well known source of standard frequency oscillations, such as, for example, a piezoelectric-crystal-controlled oscillator or a tuning-fork-controlled oscillator which generates a standard frequency fixed by the crystal, tuning fork, or other associated frequency-determining stabilizing element.

In the drawing, the block 11 represents any well known free-running oscillator operating at its natural frequency, which can be chosen to be any one of a number of possible frequencies. Thus, the oscillator may comprise a pair of grid-controlled triodes 11A, 11B which are interconnected, for example, as shown, and which have associated therewith a tuned tank circuit 11C. The triodes in the well known manner will generate a sustained frequency determined primarily by the tank circuit 11C, so as to produce the desired output frequency at the terminal 11D. Such a free-running oscillator may be said, therefore, to have a natural frequency determined by the constants of the tank circuit and the associated wiring, and which changes when such constants change with time. In any event its frequency is not as stable as that of the standard or master oscillator 10. It is characteristic of such oscillator that, if it is supplied with a control voltage from another controlling source, it can be constrained to operate at a fixed frequency determined by the frequency of the said controlling source and thus provide desired frequency stability. However, this constraining action, according to prior arrangements, is only effective where the controlling source has a frequency which bears a definite predetermined relation to the desired fixed frequency from the slave oscillator 11. In order to be able to constrain the oscillator 11 to operate at a predetermined fixed frequency, which need not have the heretofore required predetermined fixed ratio with respect to the frequency from source 10, the present invention subjects the standard frequency signal from source 10 to the action of any well known limiter and differentiating device 12 arranged to provide the desired pulse output, as will be explained. For a typical example of such limiter and differentiator, reference may be had to "Electrical Engineers Handbook," by Pender and McIlwain, fourth edition, page 9–15, published by John Wiley and Sons, Inc.

Likewise the signal from the free-running oscillator 11 is also subjected to the action of a limiter and differentiating device 13 which may be similar to the device 12. The differentiating and limited pulse outputs of the devices 12 and 13 are then applied to a coincidence gating device 14 of any well known kind. Accordingly, there appears at the output of the gate 14 an intermittent pulse signal only when the pulse outputs from the two limiters 12 and 13 are in time coincidence. When such coincidence occurs, a control signal or actuating pulse is applied over the line 15 to the control grid 11E of the free-running oscillator 11, to trigger the oscillator, thus constraining it to operate at the desired fixed frequency and maintaining it locked at that frequency under control of the oscillator 10.

In order that the invention may be more clearly understood, FIGS. 2A–2E of the drawing show typical relations between the signals from the standard oscillator 10 and the signals from the free-running oscillator 11, where these do not bear an integer relation. For example, in FIG. 2A, the signal from the oscillator 10 may have a frequency of "*n*" cycles per second and, if the oscillator 11 at any given instant generates a frequency "*m*" (FIG. 2B) where the ratio of "*n*" to "*m*" is not necessarily an integer, the said locking relation with ordinary circuits would be lost.

Figure 2A:
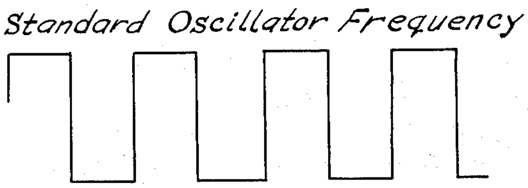
FIGS. 2A, 2B, 2C, 2D and 2E are wave diagrams used in explaining the functioning of the system of FIG. 1.
Figure 2B:
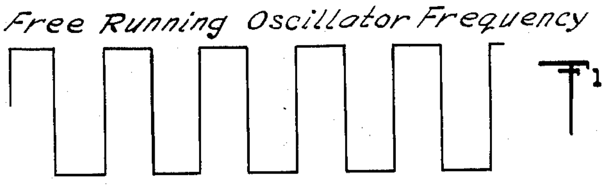
Figure 2C:
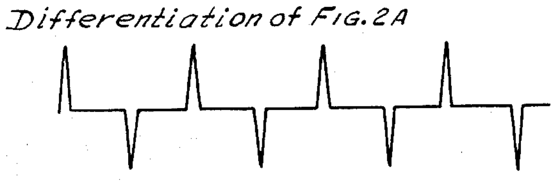
Figure 2D:
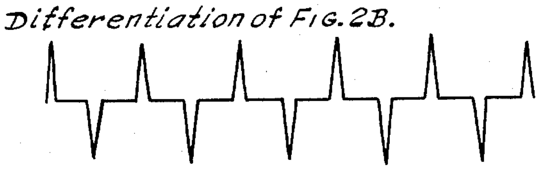

However, the invention avoids this difficulty as follows: At each transition of the standard frequency from source 10, as a result of the limiting and differentiating device 12, there are produced sharp pulses represented by the graph of FIG. 2C. Likewise the transition edges of the waves from the oscillator 11 produce corresponding differentiating pulses such as represented in FIG. 2D. Both pulses, according to the invention, are applied to a coincidence gate 14.

Figure 2E:

Therefore, as a result of the gating action, the output pulse on the conductor 15 occurs only when the pulses from the devices 12 and 13 are in time coincidence, as illustrated in FIG. 2E. Therefore, the frequency of the pulses shown in FIG. 2E will always be integrally related to the frequencies of the signal of FIGS. 2A and 2B. Consequently the oscillator 11 is constrained to operate at a fixed frequency even though it does not necessarily have an integer relation to the standard source 10. This periodic locking pulse of FIG. 2E locks in the free-running oscillator 11 even where the ratio of the frequencies from oscillators 10 and 11 is a non-integer fraction, such as for example 1794/1800 c.p.s., or for example 1806/1800 c.p.s., where the standard frequency is 1800 c.p.s. Under that condition, pulse coincidence will occur and a locking pulse will be generated every ⅙ of a second. In this manner the method of controlling signal frequency from the oscillator 11 by locking to a different fixed frequency standard such as source 10, can be extended to many frequency ratios which could not be utilized heretofore, especially where such ratios bear a non-integer relation. It will be understood, of course, that the invention is broadly applicable to the control of a free-running oscillator from a standard frequency source where the frequency relation between the oscillator and source do not have an integer relation, as well as such a high integral ratio, say 8 to 1, that there is difficulty in locking-in with conventional circuits.

Figure 3:
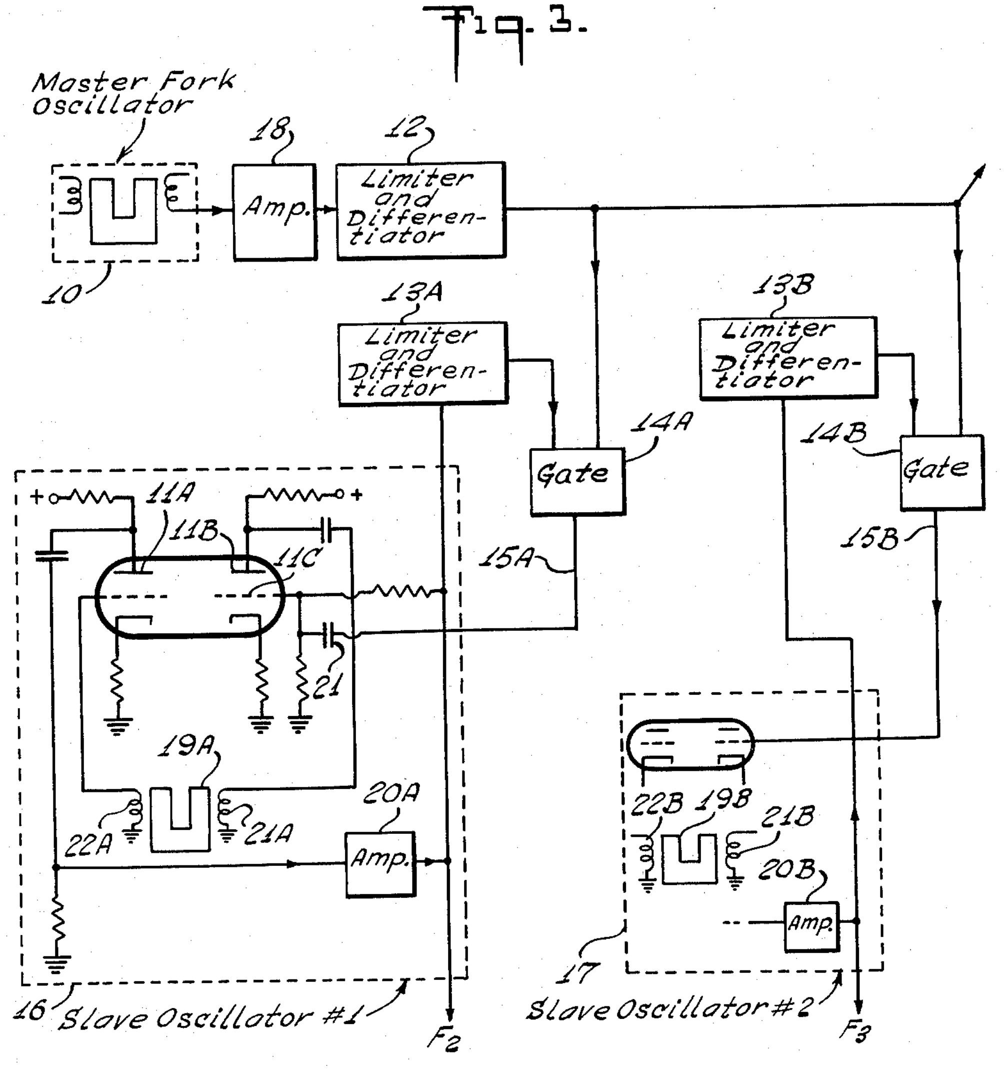
FIG. 3 is a modification illustrating another typical application of the invention.

One of the additional advantages of the invention is that the master oscillator can be used to synchronize two or more free-running slave oscillators which may be of widely different frequencies. For example, there is shown in FIG. 3 a tuning fork oscillator 10 which, for example, may be of the kind disclosed in U.S. Patent No. 2,478,330, issued August 9, 1949, and may be designed to produce an output frequency $F_1$. Two or more additional and similar slave oscillators 16 and 17 are likewise arranged to be synchronized from the master oscillator 10. The various elements of FIG. 3 which are the same as those of FIG. 1 are designated by similar numerals. Thus, the signal from the master oscillator 10 is amplified in a suitable amplifier 18 and is then applied to the limiter and differentiator 12. A portion of the output of unit 12 is applied to a coincidence gate 14A and to another coincidence gate 14B. The triodes 11A, 11B generate oscillations primarily under control of the associated tuning fork 19A to produce at the output of triode 11A oscillations of frequency $F_2$ which are amplified in any suitable amplifier 20A. A portion of these amplified oscillations of frequency $F_2$ are applied to a limiter and differentiator 13A whose output is also applied to the coincidence gate 14A. When the differentiated pulses from units 12 and 13A are coincident in time at input of gate 14A, there is produced an output pulse on the conductor 15A which is applied to the control grid 11C of the triode 11B, through capacitor 21, thus constraining the slave oscillator 16 to run at a frequency fixed by the master oscillator 10. Similarly, the portion of the output frequency $F_3$ from the slave oscillator 17 is applied to the limiter and differentiator 13B whose output is applied to the gate 14B. The timed coincidence of the differentiated pulses from units 12 and 13B produces a control pulse on the conductor 15B which likewise constrains the oscillator 17 to operate at the desired frequency $F_3$ which is therefore fixed with the same order of stability as that of the master oscillator 10. It will be understood, of course, that the system of FIG. 3 is not limited to the particular kind of slave oscillators illustrated and the gated output on conductors 15A, 15B, etc., can be applied at any other point in the associated slave oscillator circuit which is effective to drive the fork or tank circuit thereof. Thus, while the control pulse from conductor 15A is applied to the control grid of triode 11B whose plate or output anode is connected to the fork driving winding 21A and whose pick up winding 22A is connected to the control grid of triode 11A, it will be understood that the control signal can be applied at any other point in the fork amplifier circuit which is coupled to the drive coil 21A for the fork. Thus, in the system of FIG. 3, a plurality of forks which are not temperature compensated or otherwise of precise frequency may be controlled with the frequency stability of the master fork oscillator 10. In accordance with the invention, only one precision standard is required for the production of a large number of stable and, if desired, widely differing frequencies.

Various changes and modifications may be made in the disclosed embodiment without departing from the spirit and scope of the invention.

What is claimed is:

1. A frequency control system, comprising two oscillator sources one of which is a master source and the other a slave source, and means to constrain the slave source to operate at a predetermined frequency having a definite fixed relation to the frequency of the master source, the last mentioned means including a first device for deriving pulses from wave transitions of the master source, another device for deriving other pulses from wave transitions of the slave source, a pulse coincidence device upon which both sets of pulses are impressed to produce gated output pulses only when the pulses in the two sets are in timed coincidence, and means to apply said gated output pulses to trigger the circuit of said slave source to correct any tendency to drift in frequency.

2. A frequency control system, comprising a master oscillator of fixed frequency, a slave oscillator of a frequency differing from that of said master oscillator, means including differentiation means to derive pulses from wave transitions of both oscillators, a coincidence detector upon which said pulses are impressed to produce an output consisting of pulses spaced in time and generated only in response to coincident pulses at the input of the detector, and means to apply said output to trigger said slave oscillator.

3. A frequency control system according to claim 2 in which said master oscillator is a frequency stabilized oscillator, said slave oscillator is a free-running oscillator of predetermined frequency but subject to greater frequency drift than said master oscillator, and said gated output constrains said free-running oscillator to operate at said predetermined frequency.

4. A frequency control system, comprising a master oscillator which operates at a stabilized frequency $F_1$, a slave oscillator having normally a frequency approximately $F_2$, where the ratio of $F_1$ to $F_2$ is not an integer, or wherein $F_1$ and $F_2$ are widely separated numerically, and means controlled by coincident pulses derived from wave transitions of both oscillators to periodically trigger said slave oscillator and thereby constrain it to operate at exactly said frequency $F_2$.

5. A frequency control system, comprising a master oscillator which operates at a stabilized frequency $F_1$, limiter and differentiator means upon which the waves from said master oscillator are impressed to produce pulses correlated with the wave transitions from the master oscillator, a free-running oscillator, wave limiting and differentiating means upon which the waves from said free-running oscillator are impressed to produce other pulses corelated with the wave transitions from the free-running oscillator, a coincidence gate upon which the two sets of pulses are impressed to produce a gated output only in response to timed coincidence of the two sets of pulses, and means to apply said gated output to trigger said free-running oscillator to stabilize it at a frequency $F_2$.

6. A frequency control system according to claim 5, in which said free-running oscillator is of the tuning fork controlled kind which is subject to frequency drift, and said gated output is applied to the drive winding of the tuning fork to constrain it to vibrate at freqeuncy $F_2$ with the same order of stability as that of the master oscillator.

7. A frequency control system, comprising a master oscillator, a plurality of slave oscillators arranged to oscillate at respectively different frequencies, means including a differentiating device to derive regular pulses from the master oscillator, means including another differentiating device for each slave oscillator to derive therefrom respective periodic pulses corresponding to the frequencies thereof, a plurality of coincidence gates one for each slave oscillator, means to impress upon each gate the differentiated pulses from the master oscillator and the differentiated pulses from the associated slave oscillator to produce spaced discrete control pulses for the associated slave oscillator, and means for utilizing said control pulses for constraining each slave oscillator, by periodically pulsing it, to operate at its respective frequency with a stability substantially the same as that of the master oscillator.

8. A frequency control system, comprising a master oscillator which operates at a stabilized master frequency F, a plurality of slave oscillators which are to operate at respectively different frequencies, which frequencies are not integrally related to the said frequency F, means to produce pulses timed with the wave transitions of the master frequency, means associated with each slave oscillator to produce pulses timed with wave transitions of the associated slave oscillator, a coincidence gate for each slave oscillator, means to apply to the coincidence inputs of each gate the pulses from the master oscillator and the pulses from the associated slave oscillator to produce in the output of each gate a corresponding control pulse, only upon the occurrence of coincidental input pulses, and means to apply the control pulse from each gate to trigger the associated slave oscillator to constrain it to oscillate at its assigned frequency with the same order of stability as that of the master oscillator.

9. An oscillation generating system comprising a source of oscillations of frequency $F_1$, a free-running oscillator of frequency $F_2$, where the ratio of $F_1$ to $F_2$ is not an integer, wave limiting and differentiating means upon which the oscillations from said source are impressed to produce pulses of a frequency related to $F_1$, wave limiting and differentiating means upon which the oscillations from said free-running oscillator are impressed to produce pulses of a frequency related to $F_2$, a pulse coincidence detector upon which both said series of pulses are impressed to produce an output only in response to coincident pulses at the input of said detector, and means to apply said output to periodically trigger said free-running oscillator to stabilize its frequency.

References Cited by the Examiner

UNITED STATES PATENTS

| | | | |
|---|---|---|---|
| 2,574,482 | 11/51 | Hugenholtz | 331—19 |
| 2,773,188 | 12/56 | Hugenholtz | 331—19 |
| 2,774,872 | 12/56 | Howson | 331—27 |

FOREIGN PATENTS

| | | |
|---|---|---|
| 493,238 | 5/53 | Canada. |

ROY LAKE, *Primary Examiner.*

JOHN KOMINSKI, *Examiner.*